United States Patent
Yu

(10) Patent No.: US 8,660,808 B2
(45) Date of Patent: Feb. 25, 2014

(54) METHOD FOR ACCURATE BATTERY RUN TIME ESTIMATION UTILIZING LOAD-CONDITION VOLTAGE

(75) Inventor: Huili Yu, Mission Viejo, CA (US)

(73) Assignee: Broadcom Corporation, Irvine, CA (US)

( * ) Notice: Subject to any disclaimer, the term of this patent is extended or adjusted under 35 U.S.C. 154(b) by 666 days.

(21) Appl. No.: 12/315,427

(22) Filed: Dec. 2, 2008

(65) Prior Publication Data

US 2010/0138175 A1 Jun. 3, 2010

(51) Int. Cl.
*G01R 31/36* (2006.01)

(52) U.S. Cl.
USPC .............................. 702/63; 320/106; 320/132

(58) Field of Classification Search
USPC ............ 702/61, 62, 63, 64, 65; 320/134, 136, 320/162, 165, 106, 132
See application file for complete search history.

(56) References Cited

U.S. PATENT DOCUMENTS

| | | | |
|---|---|---|---|
| 4,433,294 A * | 2/1984 | Windebank | 324/426 |
| 5,606,242 A * | 2/1997 | Hull et al. | 320/106 |
| 5,608,324 A | 3/1997 | Yoshida | |
| 5,744,963 A | 4/1998 | Arai et al. | |
| 5,965,998 A * | 10/1999 | Whiting et al. | 320/165 |
| 6,025,695 A * | 2/2000 | Friel et al. | 320/106 |
| 6,150,823 A | 11/2000 | Takahashi et al. | |
| 6,469,471 B1 * | 10/2002 | Anbuky et al. | 320/118 |
| 6,847,188 B2 * | 1/2005 | Keskula et al. | 320/101 |
| 7,218,118 B1 * | 5/2007 | Gonring | 324/429 |
| 7,528,577 B2 * | 5/2009 | Hara et al. | 320/132 |
| 7,557,540 B2 * | 7/2009 | Kao et al. | 320/132 |
| 2004/0090207 A1 * | 5/2004 | Ooi et al. | 320/132 |
| 2006/0097699 A1 * | 5/2006 | Kamenoff | 320/132 |
| 2007/0229035 A1 * | 10/2007 | Fukute et al. | 320/132 |
| 2009/0055110 A1 * | 2/2009 | Kelley et al. | 702/63 |

* cited by examiner

*Primary Examiner* — John H Le
(74) *Attorney, Agent, or Firm* — Farjami & Farjami LLP

(57) ABSTRACT

A method for accurately estimating a run time of a battery utilized by an electronic device. The method comprises determining a starting battery capacity utilizing an open-circuit voltage of the battery, determining a battery capacity decline rate utilizing a load-condition voltage of the battery, and determining a low-voltage-alarm battery capacity during an active operation of the electronic device. The method further comprises utilizing the starting battery capacity, the battery capacity decline rate, and the low-voltage-alarm battery capacity to estimate the run time of the battery which may be determined by dividing the difference of the starting battery capacity and the low-voltage-alarm battery capacity by the battery capacity decline rate. One embodiment utilizes an open-circuit voltage lookup table, a load-condition voltage lookup table, and a low-voltage-alarm lookup table that are configured for use with a certain type of battery.

19 Claims, 4 Drawing Sheets

| Open-Circuit Voltage Lookup Table 130 ||
|---|---|
| Battery Capacity | Millivolts |
| 5 | 3662 |
| 10 | 3686 |
| 15 | 3697 |
| 20 | 3736 |
| 25 | 3757 |
| 30 | 3767 |
| 35 | 3772 |
| 40 | 3778 |
| 45 | 3787 |
| 50 | 3799 |
| 55 | 3814 |
| 60 | 3833 |
| 65 | 3861 |
| 70 | 3901 |
| 75 | 3931 |
| 80 | 3958 |
| 85 | 3980 |
| 90 | 4022 |
| 95 | 4069 |
| 100 | 4104 |

Fig. 3

| Load-Condition Voltage Lookup Table 132 ||
| Battery Capacity | Millivolts |
|---|---|
| 2 | 17 |
| 4 | 14 |
| 6 | 11 |
| 8 | 9 |
| 10 | 8 |
| 12 | 7 |
| 14 | 7 |
| 16 | 6 |
| 18 | 5 |
| ⋮ | ⋮ |
| 68 | 13 |
| 70 | 14 |
| 72 | 15 |
| 74 | 17 |
| 76 | 17 |
| 78 | 18 |
| 80 | 18 |
| 82 | 19 |
| 84 | 20 |
| 86 | 20 |
| 88 | 19 |
| 90 | 19 |
| 92 | 18 |
| 94 | 18 |
| 96 | 18 |
| 98 | 18 |
| 100 | 18 |

Fig. 4

METHOD FOR ACCURATE BATTERY RUN TIME ESTIMATION UTILIZING LOAD-CONDITION VOLTAGE

BACKGROUND OF THE INVENTION

1. Field of the Invention

The present invention is generally in the field of electronic devices. More particularly, the invention is in the field of battery and power management for electronic devices.

2. Background Art

Many modern electronic devices that are powered by a battery implement some method of monitoring the battery to estimate battery run time. For example, cellular telephones, portable media players, digital cameras, and other portable electronic devices each typically include a system for monitoring the battery coupled to the device. Presently, two types of systems are commonly used. The first type of system measures the battery voltage, and provides that battery voltage to the device for use in estimating the battery run time. The second type of system tracks the charge applied to and taken from the battery, and provides that information to the device for use in estimating the battery run time. Both types of conventional systems have attendant drawbacks.

For example, conventional systems that monitor battery voltage can provide only rough battery run time estimates because the relationship between battery voltage and battery capacity typically varies according to the load placed on the battery by the device. The load placed on the battery may vary dynamically depending on what function the device is performing, thus making battery capacity and run time estimation difficult. The second type of system, which tracks the charge applied to and taken from the battery, tends to be more expensive to implement than the first type of system, and is typically implemented in the battery of a device, instead of in the device itself, because otherwise tracked charge will become inaccurate when batteries are replaced. This type of system can also suffer inaccuracies when tracked batteries are not deeply discharged and then fully charged.

Thus, there is a need in the art for a method for accurate battery run time estimation that overcomes the disadvantages associated with utilizing conventional systems.

SUMMARY OF THE INVENTION

A method for accurate battery run time estimation utilizing load-condition voltage, substantially as shown in and/or described in connection with at least one of the figures, and as set forth more completely in the claims.

BRIEF DESCRIPTION OF THE DRAWINGS

FIG. 3 shows an open-circuit voltage lookup table according to one embodiment of the present invention.

FIG. 4 shows a load-condition voltage lookup table according to one embodiment of the present invention.

DETAILED DESCRIPTION OF THE INVENTION

The present invention is directed to a method for accurate battery run time estimation utilizing load-condition voltage. Although the invention is described with respect to specific embodiments, the principles of the invention, as defined by the claims appended herein, can obviously be applied beyond the specific embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 1:
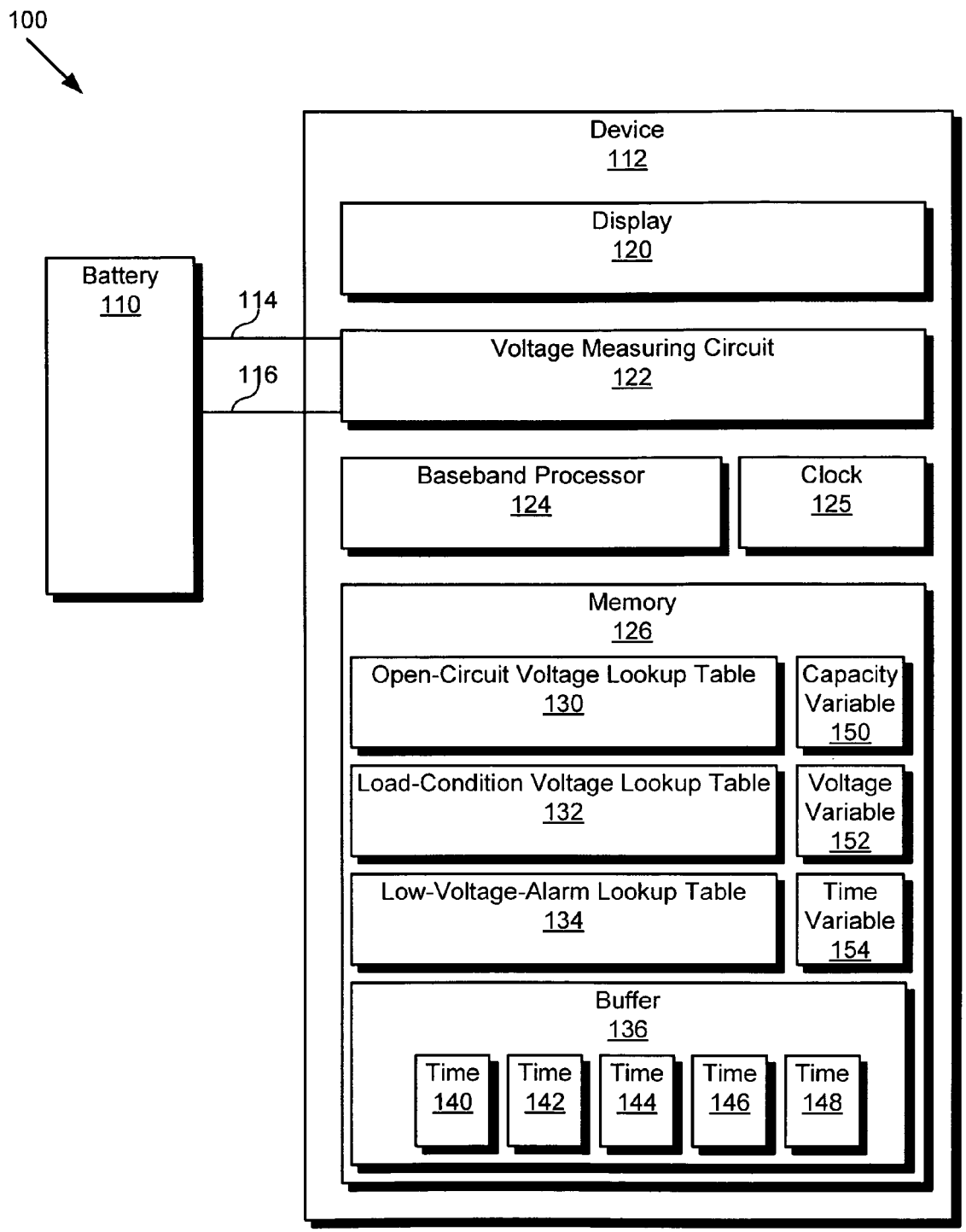
FIG. 1 shows an exemplary system for implementing one embodiment of the present invention.

In FIG. 1, system 100 for implementing one embodiment of the present invention is shown. System 100 includes, in one embodiment, battery 110 and device 112. Battery 110 comprises, in one embodiment, a lithium-ion battery by way of example. In another embodiment, battery 110 comprises a plurality of lithium-ion batteries coupled in series or parallel as known in the art. In yet another embodiment, battery 110 does not comprise a lithium-ion battery, but instead comprises a different type of battery. Battery 110 is configured, in one embodiment, to be coupled to device (or "electronic device") 112 to be discharged to provide energy for the operation of device 112, and is also configured, in one embodiment, to be charged by receiving energy from device 112, for example.

Device 112 can be implemented in one embodiment as, for example, a cellular telephone, a portable media player, a digital camera, or another portable electronic device configured to receive energy from battery 110 and to provide energy to battery 110, and also to monitor the voltage of battery 110 according to the method of the present invention. By so monitoring the voltage of battery 110 and using other information, device 112 can estimate the remaining run time of battery 110 during an active operation of device 112. Device 112 is configured to perform at least one active operation. In an embodiment in which device 112 comprises a portable media player, for example, active operations comprise, for example, playing a song, playing a movie, or performing another function of a portable media player as known in the art. Generally, battery run time is indicated by a measure of time, such as seconds, minutes, and/or hours, and is dependent on, among other things, starting capacity of the battery, battery voltage, battery capacity decline rate, and other factors. In estimating the remaining run time of battery 110, in one embodiment, device 112 estimates when a low-voltage alarm will occur, in order to alert a user of device 112 that a shutdown is imminent. The user may thus stop the active operation of the device, for example, to conserve energy, or charge the battery to continue the active operation of the device.

Device 112 comprises, in one embodiment, voltage-measuring circuit 122. Voltage-measuring circuit 122 is implemented using, for example, a voltage sensor and an analog-to-digital converter coupled to battery 110 via line 114 and line 116. Device 112 also comprises, in one embodiment, display 120, which is implemented, for example, as an electronic display configured to display information to a user of device 112. Furthermore, device 112 comprises, in one embodiment, baseband processor 124, clock 125, and memory 126. Voltage-measuring circuit 122 is, in one embodiment, coupled to baseband processor 124, while in another embodiment voltage-measuring circuit 122 is fabricated into baseband processor 124. Additionally, in one embodiment clock 125 is coupled to baseband processor 124, while in another embodiment clock 125 is fabricated into baseband processor 124. Baseband processor 124 is implemented, in one embodiment, as a microprocessor configured to perform flowchart 200 shown in FIG. 2. For example, in one embodiment baseband processor 124 is configured to execute a software implementation of flowchart 200.

In one embodiment, memory 126 is implemented as, for example, a random access memory coupled to baseband processor 124. As shown in FIG. 1, in one embodiment memory 126 stores open-circuit voltage lookup table 130, load-condition voltage lookup table 132, and low-voltage-alarm lookup table 134 (hereinafter referred to collectively as "lookup tables 130 through 134"). Additionally, memory 126 also stores, in one embodiment, capacity variable 150, voltage variable 152, and time variable 154. Furthermore, memory 126 also stores, in one embodiment, buffer 136 which, during operation, is configured to store, for example, time 140, time 142, time 144, time 146, and time 148 (hereinafter referred to collectively as times 140 through 148).

In one embodiment, lookup tables 130 through 134 are stored in a nonvolatile memory (not shown) of device 112, and are loaded by baseband processor 124 into memory 126 for use during operation. In one embodiment, lookup tables 130 through 134 contain data about lithium-ion batteries such as battery 110 (e.g., contain data about lithium-ion batteries sharing characteristics of battery 110 within design tolerances). The data in lookup tables 130 through 134 is generated, in one embodiment, during experimental trials carried out to characterize lithium-ion batteries such as battery 110 using, for example, a plurality of lithium-ion batteries. The data in each of lookup tables 130 through 134 is discussed in turn below.

First, open-circuit voltage lookup table 130 contains open-circuit voltages associated with starting battery capacities as shown, for example, in FIG. 3. In one embodiment, open-circuit voltage lookup table 130 contains a first column of starting battery capacities in 5% capacity increments (e.g. 100%, 95%, 90%, etc.), wherein each starting battery capacity is associated with an open-circuit voltage in a second column (e.g. 4.104 volts, 4.069 volts, 4.022 volts, etc.). Thus, for example, while performing flowchart 200, baseband processor 124 may look up an open-circuit voltage (e.g., represented in volts) in open-circuit voltage lookup table 130 to retrieve an associated starting battery capacity (e.g., represented as a percentage of total battery capacity). Second, load-condition voltage lookup table 132 contains battery capacities associated with load-condition voltage changes as shown, for example, in FIG. 4. In one embodiment, load-condition voltage lookup table 132 contains a first column of battery capacities in 2% capacity increments (e.g. 100%, 98%, 96%, etc.), wherein each battery capacity is associated with a load condition voltage change in a second column (e.g. 0.018 volts, 0.018 volts, 0.018 volts, etc.). Thus, for example, baseband processor 124 may look up a battery capacity (e.g., represented as a percentage of total battery capacity) in load-condition voltage lookup table 132 to retrieve an associated load-condition voltage change (e.g., represented in volts). Third, low-voltage-alarm lookup table 134 contains one or more active operations associated with low-voltage-alarm battery capacities. Thus, for example, baseband processor 124 may look up an active operation (e.g., playing a song, or making a cellular phone call) in low-voltage-alarm lookup table 134 to retrieve an associated low-voltage-alarm battery capacity (e.g., represented as a percentage of total battery capacity). A low-voltage-alarm battery capacity is, in one embodiment, a battery capacity that results in a low-voltage alarm generated by device 112, indicating that a shutdown of device 112 is imminent.

As stated above, during operation memory 126 stores buffer 136, capacity variable 150, voltage variable 152, and time variable 154 in addition to lookup tables 130 through 134. Buffer 136, capacity variable 150, voltage variable 152, and time variable 154 are, in one embodiment, areas of memory 126 allocated by baseband processor 124 for use during operation. In the present embodiment, buffer 136 comprises an area of memory 126 sufficient to store times 140 through 148, but in another embodiment buffer 136 may be allocated less space or additional space. Also, in the present embodiment capacity variable 150, voltage variable 152, and time variable 154 each comprise an area of memory 126 sufficient to store a capacity, a voltage, and a time, respectively.

Thus, as described above, device 112 comprises, in one embodiment, display 120, voltage-measuring circuit 122, baseband processor 124, clock 125, and memory 126. In one embodiment, baseband processor 124 loads lookup tables 130 through 134 into memory 126 and allocates buffer 136, capacity variable 150, voltage variable 152, and time variable 154 in memory 126 for use during operation. As described below, in one embodiment of the present invention flowchart 200 (implemented as, for example, software executing on baseband processor 124) utilizes data from voltage-measuring circuit 122 and data stored in memory 126 to estimate the remaining run time of battery 110.

Figure 2:
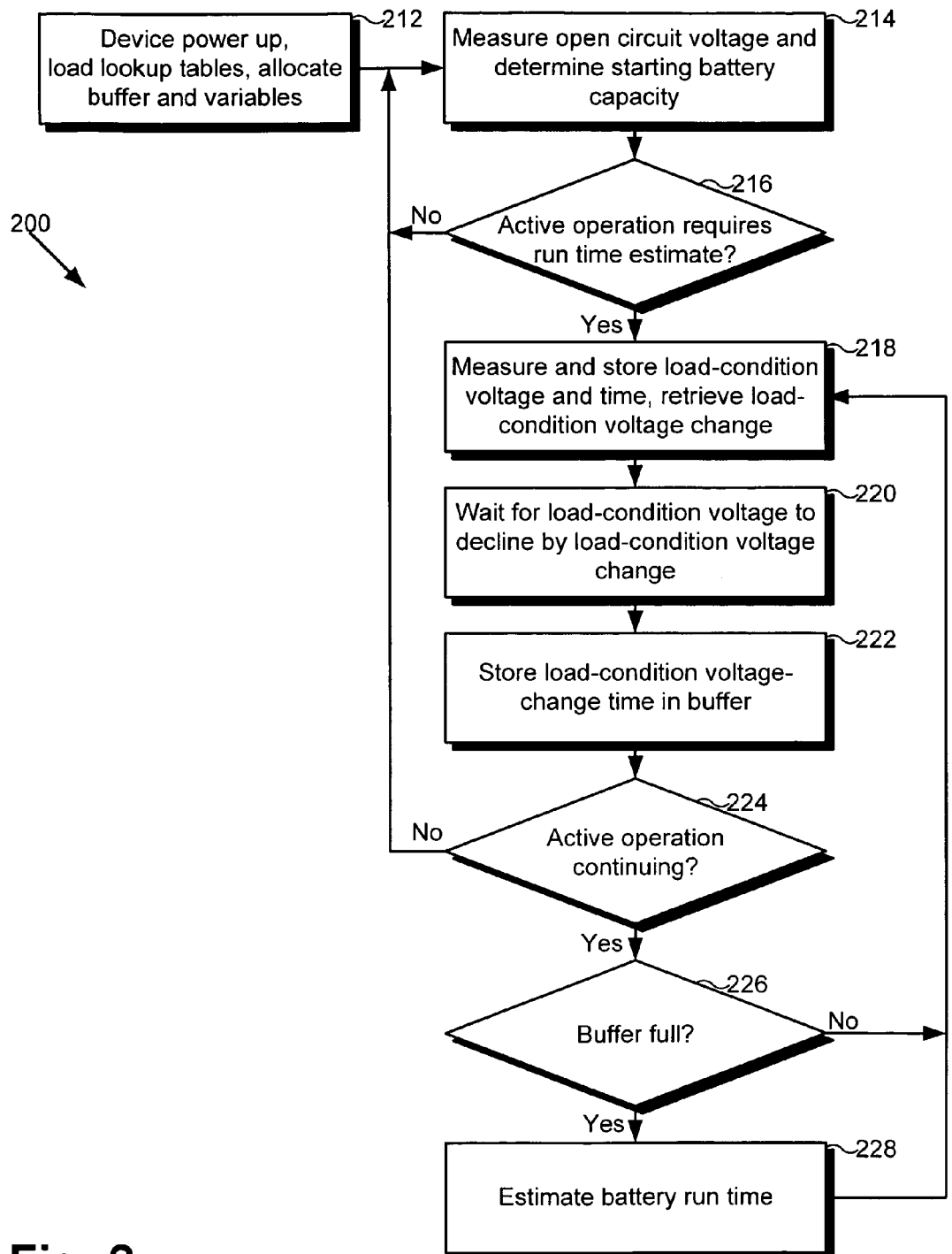
FIG. 2 shows a flowchart presenting an exemplary method for battery run time estimation according to one embodiment of the present invention.

FIG. 2 shows flowchart 200 illustrating an exemplary method for battery run time estimation according to one embodiment of the present invention. Certain details and features have been left out of flowchart 200 that are apparent to a person of ordinary skill in the art. For example, a step may consist of one or more substeps or may involve specialized equipment or materials, as known in the art. Steps 212 through 228 indicated in flowchart 200 are sufficient to describe one embodiment of the present invention; however, other embodiments of the invention may utilize steps different from those shown in flowchart 200. It is noted that the steps shown in flowchart 200 are performed, in one embodiment, utilizing display 120, voltage-measuring circuit 122, baseband processor 124, clock 125, lookup tables 130 through 134, buffer 136, capacity variable 150, voltage variable 152, and time variable 154 shown in FIG. 1.

In step 212 of flowchart 200, device 112 powers up after, for example, being coupled to battery 110 and being turned on by a user of device 112. After being turned on, in one embodiment during step 212 baseband processor 124 loads lookup tables 130 through 134 from a nonvolatile memory, and allocates buffer 136, capacity variable 150, voltage variable 152, and time variable 154 for use during operation in subsequent steps of flowchart 200. In subsequent steps 214 through 228, flowchart 200 determines whether device 112 is performing an active operation that requires a battery run time estimate and, if so, determines a battery run time estimate.

In step 214 of flowchart 200, in one embodiment device 112 measures the open-circuit voltage of battery 110 and then determines the starting battery capacity of battery 110. In one embodiment, device 112 measures the open-circuit voltage of battery 110 via line 114 and 116 utilizing, for example, voltage-measuring circuit 122. In another embodiment in which device 112 is, for example, performing an active operation that prevents measuring the open-circuit voltage of battery 110, device 112 calculates the open-circuit voltage from one or more load-condition voltage measurements of battery 110. Device 112 then proceeds, in one embodiment, to determine the starting battery capacity of battery 110 by looking up the open-circuit voltage in open-circuit voltage lookup table 130 and retrieving the associated starting battery capacity. For example, in one embodiment, if the open-circuit voltage is 4.022 volts, device 112 retrieves from open-circuit voltage lookup table 130 a starting battery capacity of 90%. After looking up the starting battery capacity, device 122 stores the starting battery capacity in capacity variable 150, and flowchart 200 proceeds to step 216.

In step 216 of flowchart 200, in one embodiment device 112 determines whether the active operation being performed by device 112 requires estimating the battery run time. Various active operations that can be performed by device 112, such as, for example, playing a song, playing a movie, making a cellular telephone call, or performing a long-duration activity, require estimating the battery run time. Making such an estimate for certain active operations is necessary, for example, because the active operations may be performed for a long period of time, during which the user benefits from being aware of an estimate. However, certain other active operations such as, for example, sending a text message or retrieving email from a remote server do not require making a battery run time estimate, in one embodiment, because such active operations typically only require a short period of time to perform. Thus, if device 112 determines that the active operation being performed requires a run time estimate in step 216, then flowchart 200 proceeds to step 218, but if the active operation being performed does not require a run time estimate, then flowchart 200 returns to step 214.

In step 218 of flowchart 200, in one embodiment device 112 measures a load-condition voltage of battery 110 via line 114 and 116 utilizing, for example, voltage-measuring circuit 122. Device 112 then stores the load-condition voltage in voltage variable 152. Device 112 also then retrieves the present time from clock 125 and stores the present time in time variable 154. Additionally, device 112 also retrieves a battery capacity stored in capacity variable 150 (previously stored during step 214, as described above) and looks up the retrieved battery capacity in load-condition voltage lookup table 132 to retrieve an associated load-condition voltage change. Thus, in one embodiment during step 218 device 112 stores a load-condition voltage of, for example, 3.820 volts, stores the present time of, for example, 100 seconds, and utilizes a 90% value stored in capacity variable 150 to retrieves a load-condition voltage change of 0.019 volts from load-condition voltage lookup table 132.

In step 220 of flowchart 200, in one embodiment device 112 monitors the load-condition voltage of battery 110 while device 112 continues performing the active operation. As energy is removed from battery 110 while performing the active operation, in one embodiment the monitored load-condition voltage of battery 110 declines. Device 1112 periodically (e.g., once per second) compares the load-condition voltage of battery 110 to the value stored in voltage variable 152. For example, in one embodiment, between 101 and 102 seconds, the load-condition voltage may decline 0.001 volts, from 3.820 volts to 3.819 volts. When the difference between the measured load-condition voltage and the value stored in voltage variable 152 equals or exceeds the load-condition voltage change retrieved in step 218, as described above, step 220 is complete.

In step 222 of flowchart 200, device 112 has finished waiting for the difference between the measured load-condition voltage and the value stored in voltage variable 152 to equal or exceed the load-condition voltage change. For example, in one embodiment the load-condition voltage declines 0.019 volts, from 3.820 volts to 3.801 volts. Thus, device 112 proceeds to store the amount of time spent waiting (in one embodiment, the "load-condition voltage-change time") in step 220 in time 140 of buffer 136. The load-condition voltage-change time is, in one embodiment, the time required during a performance of the active operation for the load-condition voltage of battery 110 to decline by the load-condition voltage change. For example, if the time spent waiting in step 220 was between time 100 seconds and time 190 seconds, according to clock 125, then the load-condition voltage-change time of 90 seconds is stored in time 140. Device 112 also replaces the battery capacity stored in capacity variable 150 with the next (e.g., adjacent) lower battery capacity in load-condition voltage lookup table 132. For example, in an embodiment in which load-condition voltage lookup table 132 stores load-condition voltage changes associated with battery capacity in two percent capacity increments, and if the battery capacity stored in capacity variable 150, prior to step 222, is 90%, then 88% is stored in capacity variable 150 during step 222.

After step 222, during step 224 of flowchart 200 device 112 determines whether the active operation (which was determined to require a run time estimate in step 216) is continuing. If the active operation is not continuing, flowchart 200 returns to step 214. However, if the active operation is continuing, flowchart 200 proceeds to step 226. The active operation may not be continuing, for example, if during the time spent waiting in step 220, the user of device 112 stopped performing the active operation. In one embodiment, in step 224 device 112 may determine that the user has finished playing a movie, for example, and thus a run time estimate is no longer required.

In step 226 of flowchart 200, device 112 determines whether buffer 136 is full. In one embodiment, device 112 determines whether buffer 136 is full by determining whether each of times 140 through 148 have a stored value. As described above, only time 140 of buffer 136 has a value stored (e.g., 90 seconds) after a first pass through step 218, step 220, and step 222. Each of times 140 through 148 will have a stored value only after, in one embodiment, four subsequent repetitions of step 218, step 220, and step 222 have been completed. In particular, in one embodiment, time 142, time 144, time 146, and time 148 are filled, for example, after five total repetitions of step 218, step 220, and step 222. Because, in the present embodiment, only time 140 has a stored value after the first pass through step 218, step 220, and step 222, flowchart 200 returns to step 218 from step 226. Flowchart 200 then proceeds again through step 218, step 220, and step 222 in the manner described above, thereby storing another load-condition voltage-change time in time 142 of buffer 136. After four such subsequent repetitions, in one embodiment, time 142, time 144, time 146, and time 148 are filled respectively with, for example, 95 seconds, 100 seconds, 80 seconds, and 90 seconds, as energy is removed from battery 110 during an exemplary active operation. Notably, during each successive repetition, capacity variable 150 stores, respectively, 86%, 84%, 82%, and then 80%, according to the next lowest (e.g., adjacent) battery capacity increments of load-condition voltage lookup table 132. Repetitions of step 218, step 220, and step 222 occur a total of five times, in one embodiment, such that after the fifth cycle, each of times 140 through 148 of buffer 136 has a stored value, and flowchart proceeds from step 226 to step 228.

In step 228 of flowchart 200, in one embodiment reached from step 226 after each of times 140 through 148 of buffer 136 has a stored value, device 112 estimates the battery run time. Device 112 does so, for example, by using the battery capacity stored in capacity variable 150 after five repetitions of step 218, step 220, and step 222, by using a battery capacity decline rate calculated from buffer 136, and by using a low-voltage-alarm battery capacity. The battery capacity decline rate is calculated from buffer 136 by, in one embodiment, dividing the battery capacity percentage usage increment represented by each of times 140 through 148 by the average of the values stored in times 140 through 148 (thus, the battery capacity decline rate, in one embodiment, is determined utilizing the most recently determined load-condition voltage-change time and at least one previously determined voltage-change time). For example, in one embodiment the battery capacity decline rate is equal to 2% (the battery capacity percentage usage increment) divided by the sum of 90 seconds, 95 seconds, 100 seconds, 80 seconds, and 90 seconds divided by 5 (i.e. 91 seconds), such that the battery capacity decline rate is equal to, for example, 2% battery capacity decline per 91 seconds. The low-voltage-alarm battery capacity is determined during the active operation of device 112 by looking up the active operation in low-voltage-alarm lookup table 134 to retrieve the associated low-voltage-alarm battery capacity. For example, if device 112 is performing an active operation of playing a song, in one embodiment the associated low-voltage-alarm battery capacity is 10%.

After determining the battery capacity decline rate and retrieving the low-voltage-alarm battery capacity in step 228, in one embodiment step 228 continues by estimating the run time of battery 110 to equal the battery capacity stored in capacity variable 150 minus the low-voltage-alarm battery capacity, divided by the battery capacity decline rate. For example, in one embodiment the run time estimate is 80% minus 10% divided by 2% battery capacity decline per 91 seconds, which equals 3,185 seconds, or approximately 53 minutes. In one embodiment, step 228 concludes by displaying the battery run-time estimate to a user of device 112 via display 120.

The invention's unique combination of, for example, a voltage-measuring circuit, an open-circuit voltage lookup table, a load-condition voltage lookup table, a low-voltage-alarm lookup table, and a buffer containing time values, as described above, permits the invention to operate with several advantages over conventional systems. For example, in one embodiment the invention avoids problems caused by tracking the charge of the battery, because as described above the invention also monitors battery voltage. Furthermore, for example, in one embodiment the invention produces accurate run time estimates despite dynamically varying loads being placed on the battery depending on which active operation the device is performing.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. A method for accurately estimating a run time of a battery utilized by an electronic device, the method comprising:
    determining a starting battery capacity by measuring only an open-circuit voltage of said battery, said open-circuit voltage measured by a voltage-measuring circuit;
    determining whether an active operation performed by said electronic device requires estimating said run time of said battery;
    determining a battery capacity decline rate utilizing a load-condition voltage of said battery measured by said voltage-measuring circuit;
    determining a low-voltage-alarm battery capacity by looking up and retrieving said low-voltage-alarm battery capacity from a plurality of low-voltage alarm battery capacities based on said low-voltage-alarm battery capacity being associated with said active operation, during said active operation of said electronic device;
    utilizing said starting battery capacity, said battery capacity decline rate, and said low-voltage-alarm battery capacity to estimate said run time of said battery.

2. The method of claim 1, wherein said starting battery capacity is determined by using an open-circuit voltage lookup table.

3. The method of claim 1, wherein said battery capacity decline rate is determined by utilizing a change in said load-condition voltage of said battery.

4. The method of claim 1, wherein said utilizing said load-condition voltage of said battery comprises retrieving a load-condition voltage change from a load-condition voltage lookup table.

5. The method of claim 1, wherein said utilizing said load-condition voltage of said battery comprises determining a load-condition voltage-change time.

6. The method of claim 5, wherein said determining said battery capacity decline rate comprises utilizing said load-condition voltage-change time and at least one previously determined voltage-change time.

7. The method of claim 1, wherein said low-voltage-alarm battery capacity is determined by using a low-voltage-alarm lookup table.

8. The method of claim 1, further comprising utilizing an open-circuit voltage lookup table, a load-condition voltage lookup table, and a low-voltage-alarm lookup table.

9. The method of claim 8, wherein said open-circuit voltage lookup table, said load-condition voltage lookup table, and said low-voltage-alarm lookup table are configured for use with a plurality of batteries.

10. The method of claim 1, wherein said battery is a lithium-ion battery.

11. The method of claim 1, wherein said battery is configured for use with an electronic device selected from the group consisting of a cellular telephone, a portable media player, a digital camera, and a portable electronic device.

12. The method of claim 1, wherein said active operation is selected from the group consisting of playing a song, playing a movie, and making a cellular telephone call.

13. The method of claim 1, further comprising displaying an estimate of said run time of said battery to a user.

14. A method for accurately estimating a run time of a battery utilized by an electronic device, the method comprising:
    determining a starting battery capacity by measuring only an open-circuit voltage of said battery, said open-circuit voltage measured by a voltage-measuring circuit;
    determining whether an active operation performed by said electronic device requires estimating said run time of said battery;
    determining a battery capacity decline rate utilizing a load-condition voltage of said battery measured by said voltage-measuring circuit;
    determining a low-voltage-alarm battery capacity by looking up and retrieving said low-voltage-alarm battery capacity from a plurality of low-voltage alarm battery capacities based on said low-voltage-alarm battery capacity being associated with said active operation, during said active operation of said electronic device;

dividing a difference of said starting battery capacity and said low-voltage-alarm battery capacity by said battery capacity decline rate to estimate said run time of said battery.

15. The method of claim 14, wherein said starting battery capacity is determined by using an open-circuit voltage lookup table.

16. The method of claim 14, wherein said utilizing said load-condition voltage of said battery comprises retrieving a load-condition voltage change from a load-condition voltage lookup table.

17. The method of claim 14, wherein said low-voltage-alarm battery capacity is determined by using a low-voltage-alarm lookup table.

18. The method of claim 14, wherein said battery is configured for use with an electronic device selected from the group consisting of a cellular telephone, a portable media player, a digital camera, and a portable electronic device.

19. The method of claim 14, wherein said active operation is selected from the group consisting of playing a song, playing a movie, and making a cellular telephone call.

* * * * *